(12) United States Patent
deVilliers

(10) Patent No.: US 9,437,447 B2
(45) Date of Patent: Sep. 6, 2016

(54) METHOD FOR PATTERNING A SUBSTRATE FOR PLANARIZATION

(71) Applicant: Tokyo Electron Limited, Minato-ku, Tokyo (JP)

(72) Inventor: Anton J. deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/624,091

(22) Filed: Feb. 17, 2015

(65) Prior Publication Data

US 2015/0243519 A1 Aug. 27, 2015

Related U.S. Application Data

(60) Provisional application No. 61/943,486, filed on Feb. 23, 2014, provisional application No. 61/943,483, filed on Feb. 23, 2014.

(51) Int. Cl.

| | |
|---|---|
| *H01L 21/302* | (2006.01) |
| *H01L 21/3105* | (2006.01) |
| *H01L 21/02* | (2006.01) |
| *H01L 21/311* | (2006.01) |
| *H01L 21/033* | (2006.01) |

(52) U.S. Cl.
CPC ..... *H01L 21/31055* (2013.01); *H01L 21/0228* (2013.01); *H01L 21/0337* (2013.01); *H01L 21/31111* (2013.01)

(58) Field of Classification Search
CPC .................. H01L 21/76816; H01L 21/76837; H01L 21/0337; H01L 21/31055; H01L 21/0228; H01L 21/31111
USPC ............. 438/694, 671, 669, 479; 216/37, 67
See application file for complete search history.

(56) References Cited

U.S. PATENT DOCUMENTS

| | | | |
|---|---|---|---|
| 2007/0148968 A1 | 6/2007 | Kwon et al. | |
| 2010/0136784 A1* | 6/2010 | Mebarki | H01L 21/0337 438/669 |
| 2011/0111596 A1 | 5/2011 | Kanakasabapathy | |
| 2011/0151668 A1 | 6/2011 | Tang et al. | |
| 2011/0269252 A1* | 11/2011 | Sant | H01L 21/3086 438/9 |
| 2012/0111832 A1* | 5/2012 | Doyle | B82Y 10/00 216/47 |

OTHER PUBLICATIONS

International Patent Application No. PCT/US2015/016164, "International Search Report and Written Opinion," mailed May 22, 2015, International Filing Date Feb. 17, 2015.
Taiwanese Office Action issued in TW 10421760510 mailed Dec. 30, 2015 with English Language Translation.

* cited by examiner

*Primary Examiner* — Duy Deo
*Assistant Examiner* — Maki Angadi
(74) *Attorney, Agent, or Firm* — DLA Piper LLP US

(57) ABSTRACT

Techniques disclosed herein include increasing pattern density for creating high-resolution contact openings, slots, trenches, and other features. A conformal spacer is applied on a bi-layer or tri-layer mandrel (multi-layer) or other relief feature. The conformal spacer thus wraps around the mandrels and is also deposited on an underlying layer. A fill material is deposited to fill gaps or spaces between sidewall spacers. A CMP planarization step then removes substrate stack material down to a material interface of the bi-layer or tri-layer mandrel, with a middle or lower material of the mandrel being a CMP-stop material. This technique essentially cuts off or removes rounded features such as upper portions of sidewall spacers, thereby providing a spacer material with a planar top surface that can be uniformly etched and transferred to underlying layers.

20 Claims, 8 Drawing Sheets

METHOD FOR PATTERNING A SUBSTRATE FOR PLANARIZATION

CROSS REFERENCE TO RELATED APPLICATIONS

The present application claims the benefit of U.S. Provisional Patent Application No. 61/943,486, filed on Feb. 23, 2014, entitled "Method for Patterning a Substrate for Planarization," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of traditional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes including feature sizes of 14 nanometers and below. This continual reduction in sizes of features from which various elements are fabricated places ever-greater demands on techniques used to form the features. The concept of "pitch" can be used to describe the sizing of these features. Pitch is the distance between the two identical points in two adjacent repetitive features.

Pitch reduction techniques, often somewhat erroneously termed "pitch multiplication" as exemplified by "pitch doubling" etc., can extend the capabilities of photolithography beyond feature size limitations (optical resolution limitations). That is, conventional multiplication of pitch (more accurately pitch reduction or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm.

Techniques disclosed herein, provide a method for pitch reduction (increasing pitch/feature density) for creating high-resolution features. Patterning techniques herein can quadruple a density of features in a given pattern, or dramatically reduce feature size. In other words, such patterning techniques can take an initial critical dimension pitch and reduce this initial pitch so that it is a quarter or less of its initial size. This feature reduction technique also provides features or openings having high uniformity and fidelity.

One embodiment includes a method of patterning a substrate for planarization. This method includes providing a substrate having a relief pattern of structures located on a target layer. Structures in the relief pattern of structures comprise at least two layers of material including an upper material layer positioned on a planarization stop material layer. The upper material layer differs from the planarization stop material layer. A conformal film is deposited on exposed surfaces of the target layer and on exposed surfaces of the structures such that sidewall depositions result on vertical surfaces of the structures. The conformal film is etched such that the conformal film is at least removed from portions of target layer surfaces at locations between sidewall depositions of the conformal film. A fill material is deposited that at least partially fills spaces defined between the sidewall depositions of the conformal film. The substrate is planarized by removing conformal film material, upper material layer, and fill material above a top surface of the planarization stop material layer such that a planar surface is formed at the top surface of the planarization stop material layer.

Another embodiment includes a method of patterning a substrate for planarization. This method includes providing a substrate having a relief pattern of structures located on a target layer. Structures in the relief pattern of structures comprise at least three layers of material including a lower material layer positioned on the target layer, a planarization stop material layer positioned on the lower material layer, and an upper material layer positioned on the planarization stop material layer. The planarization stop material layer differs from the upper material layer and the lower material layer. A conformal film is deposited on exposed surfaces of the target layer and on exposed surfaces of the structures such that sidewall depositions result on vertical surfaces of the structures. Material of the conformal film is selected such that a particular etch chemistry can etch both the conformal film and material from the lower material layer. The conformal film is etched anisotropically such that the conformal film is removed from target layer surfaces at locations between sidewall depositions of the conformal film. A fill material is deposited that fills spaces defined between the sidewall depositions of the conformal film. The substrate is planarized by removing conformal film material, upper material layer, and fill material above a top surface of the planarization stop material layer such that a planar surface is formed.

The result of this patterning process provides significant improvements in feature size reduction. Using CMP to remove fill material, and by making the top of the conformally applied spacers atomically flat provides dramatic improvement in LER/LWR. This novel technique provides an improved method for increasing the feature density and provides more compact and uniform arrays without harming feature resolution.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
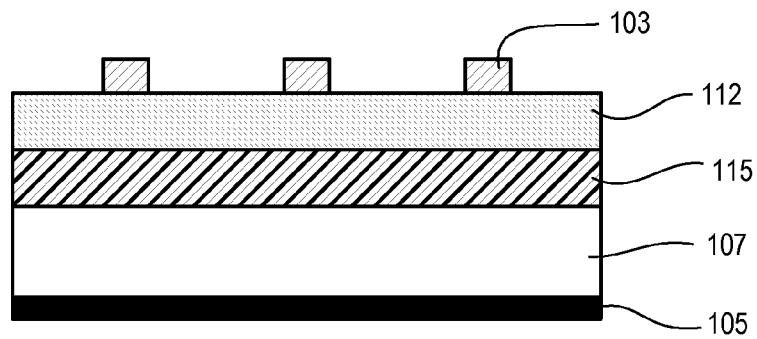
FIGS. 1-7 are cross-sectional schematic side views of an example substrate segment showing a process flow according to embodiments disclosed herein.

Techniques disclosed herein include increasing pattern density for creating high-resolution trenches, contact openings, and other features. Patterning techniques herein include combining double patterning techniques, sidewall image techniques, as well as novel planarizing techniques. Patterning techniques herein can quadruple a density of features in a given pattern. In other words, such patterning techniques can take an initial critical dimension pitch and reduce this initial pitch so that it is a quarter or eighth of its initial size, or smaller. This feature reduction technique also provides features or openings having high uniformity and fidelity. Patterning techniques herein can also enable doubled patterns at higher resolutions than is conventionally available.

In general, methods herein can include depositing a conformal spacer on a bi-layer or tri-layer mandrel (multi-layer) or other topographic feature. The conformal spacer thus wraps around the mandrels and underlying layer. A fill material is also deposited to fill gaps or spaces between sidewall spacers, and this can be overfilled on the substrate. A CMP planarization step then removes substrate stack material down to a material interface of the bi-layer or tri-layer mandrel, with a middle or lower material of the mandrel being a CMP-stop material. This technique essentially cuts off or removes rounding of the sidewall spacers, thereby providing a spacer material with a planar top surface that can be uniformly etched and transferred to underlying layers without faceting or rounding causing bowing or other undesirable etch results. In other words, a given substrate is planarized so as to cut sidewall spacers in half (more or less). One benefit with this technique is that instead of the space between spacers being transferred (either the mandrels or gaps) to an underlying layer, it is instead the spacer itself that is being exhumed to provide a pattern or opening to transfer. This is significant because the spacer material can be applied by atomic layer deposition (ALD), and since ALD films are applied one atomic monolayer at a time, a CD of the spacer (transfer CD) can be controlled at the atomic level.

Accordingly, techniques disclosed herein can provide a pattern design/layout with improved LER/LWR (Line Edge Roughness/Line Width Roughness) for 10 nm and smaller lines/trenches. Methods herein can include providing improved patterns and trenches such as for self-aligned cross pitch quad patterning techniques. In one specific example embodiment, a resist pattern is transferred to an underlying amorphous carbon and silicon nitride (SiN) layer, thereby creating structures or mandrels comprised of amorphous carbon positioned on top of silicon nitride. Then a spacer oxide is deposited over these mandrels followed by a spacer etch. Next, an overfill of the trenches/spaces is executed using amorphous carbon or other fill material. Then a planarization step, using chemical-mechanical polishing (CMP), is executed to remove excess amorphous carbon overlying SiN. The pattern can then be transferred to an underlying layer (such as polysilicon) through the oxide spacers. Subsequently the amorphous carbon and SiN can be removed. Note that the specific materials mentioned are only for convenience in describing example embodiments. In practice, any CMP-stop material can be used, that is, any material that provides a hard stop surface that effectively resists CMP polishing preventing additional material removal. Any spacer and fill material can be used so long as the spacer material can be etched selective to the fill material and the CMP-stop material (the spacer material is etched while the CMP-stop and fill material are not etched or etched at a comparatively slower rate.

Figure 3:
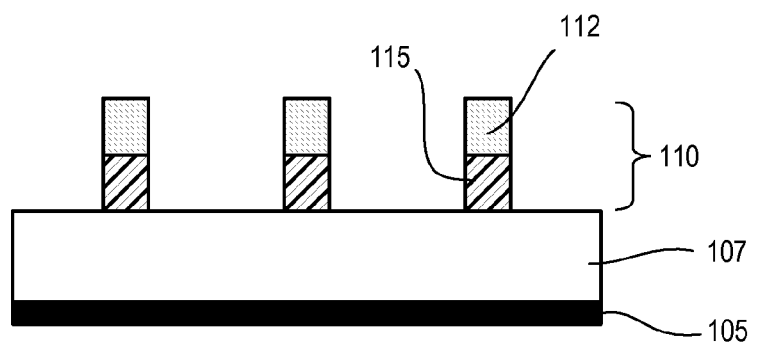

Example embodiments will now be described with reference to illustrations. Referring now to FIG. 3, embodiments include a method for patterning a substrate 105. Substrate 105 can include one or more underlying layers, as well as refer to a substrate in general upon which multiple different features can be deposited and formed. This method includes providing a substrate 105 having a relief pattern of structures located on a target layer 107. The structures 110 in the relief pattern of structures comprise at least two layers of material including an upper material layer 112 positioned on a planarization stop material layer 115. The upper material layer 112 differs from the planarization stop material layer 115, such as by having different material compositions. This relief pattern of structures can include parallel elongated structures oriented in a first direction. Note that the entire relief pattern may or may not include parallel linear structures, but at least a portion of the first structures can include multiple parallel linear structures. The view in FIG. 3 is of the elongated direction of lines and thus structures 110 (first structures) appear as mandrels. Each elongated structure of the parallel elongated structures can have a predetermined width and a positioning that defines a horizontal distance between each other that is equal to three times the predetermined width. Thus, for a least a portion of the substrate 105, feature lines can run parallel with each other and each have a width equal to one third times a spacing distance between each other. A relative height of each of the upper material layer 112 and the planarization stop material layer 115 can depend on various design objectives of a particular fabrication scheme.

The structures 110 can be considered as a two-layer mandrel or double-stacked mandrel. Although FIG. 3 shows two layers comprising the mandrels, more than two layers can be used to create these mandrels. Various different materials can be used also. By way of a non-limiting example, the upper material layer 112 can be amorphous carbon, polysilicon, oxide, etc. The upper material layer 112 can be comprised of a material different than the planarization stop material layer 115. The upper material layer 112 will eventually be removed by planarization and so plasma etch selectivity for subsequent processes does not need to be a factor for selection of this material, but good choices include materials that can be planarized by CMP relatively easily. The planarization stop material layer 115 can be silicon nitride (SiN), titanium nitride, silicon-germanium based materials, etc. Material selected for the planarization stop material layer 115 should be a material that resists chemical-mechanical polishing. In other words, the planarization stop material layer is selected to provide a CMP-stop layer.

Also note that a spacing defined by the structures 110, that is, a distance between adjacent structures of the first structures, can be equal to three times a given width of a given (individual) structure that is part of the structures 110. In other words, the substrate can be provided having a double-stacked mandrel at a 1:3 spacing ratio, or at some other spacing ratio.

Various different patterning schemes or operations can be used to arrive at the substrate stack shown in FIG. 3. For example, referring to FIG. 1, planarization stop material layer 115 can be deposited on target layer 107. Upper material layer 112 can then be deposited on planarization stop material layer 115. A pre-pattern 103, which can be a relief pattern, can be formed to create a pattern in the underlying layers. This pre-pattern layer can be a result of a double patterning process that has already been executed. In some embodiments, the pre-pattern 103 can be photoresist that has been patterned by photolithography. Note that this pre-pattern layer can have a 1:3 spacing ratio if desired. In other words, each topographic feature in the pre-pattern has a predetermined width, and the spacing distance between these topographic features is equal to three times the predetermined width. Note that these topographical features include elongated portions that form a set of parallel lines or parallel topographic features. The layers below the pre-pattern layer can be deposited as films via various deposition techniques.

Note also that other spacing schemes can be used. 1:3 pre-pattern spacing is beneficial in that the result is a 1-1-1 spacing after reduction (pattern multiplication). Other embodiments can be used for narrow trench applications and can start with other pre-pattern ratios such as 1:10. For other contact creation schemes, an initial 1:5 ratio can be used (small contact-large space-small contact-large space. A smaller ratio can enable a larger etch budget or tolerance. With a smaller contact there is more room for an over-etch while staying within a given CD budget. Another option is to form double trenches that include a large space and a double trench (an example ratio could be 1:3:1:8:1:3:1:8).

Figure 2:
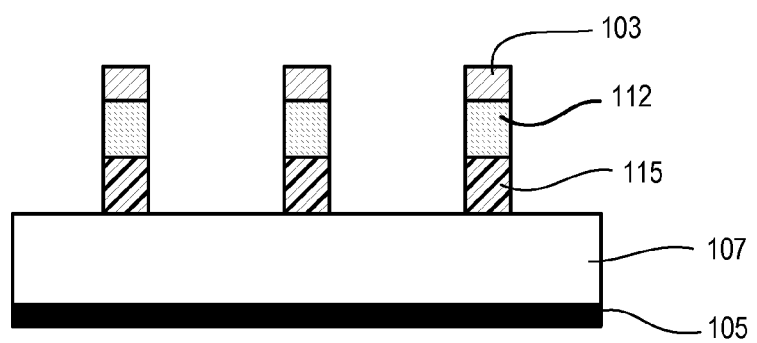

Whichever pre-pattern and spacing scheme selected can be transferred into two or more underlying layers to form double-stacked or triple stacked mandrels as shown in FIG. 2. Such a pattern transfer is typically executed via an anisotropic etch process. Etch chemistry can be adjusted depending on types of materials being etched. After etch transfer of the pre-pattern layer is completed, the pre-pattern layer can be removed via conventional material removal techniques based on type of materials used. This can include an ashing process or a wet-clean process, etc. The result is a relief pattern of structures.

Figure 4:
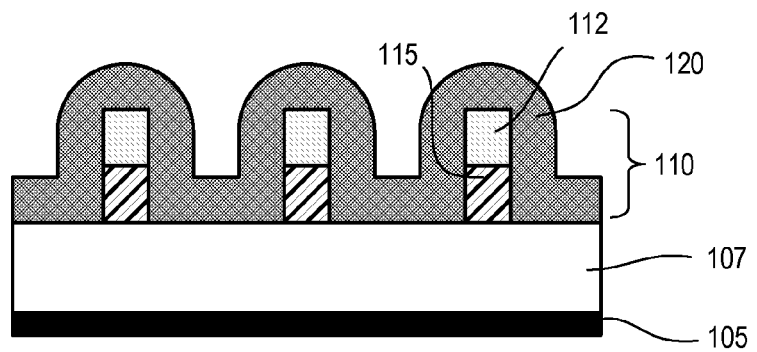

Referring now to FIG. 4, a conformal film 120 is deposited on exposed surfaces of the structures 110 and on exposed surfaces of the target layer 107 so that sidewall depositions result on vertical surfaces of the structures 110. Conformal film 120 can have a deposited thickness approximately equal to the predetermined width of the structures 110. Such a conformal film can be applied via atomic layer deposition (ALD), for example. One benefit of using ALD is that a thickness of such a conformal film can be controlled on an atomic level. By way of a non-limiting example, conformal film 120 can be an oxide. In other embodiments, a thickness of the conformal film can be greater than or less than a width of the mandrels. Some embodiments can include having sidewall spacers with a high aspect ratio (5:1 or 10:1, etc., for example) because sidewall spacers created from the conformal film will be supported on both sides by material. Accordingly, a comparatively thin conformal film can be deposited without concern of toppling because the conformal film will have material supporting it on both sides. In other words, a sidewall space with a relatively high aspect ratio does not need to be free standing at any point during the fabrication process.

Figure 5:
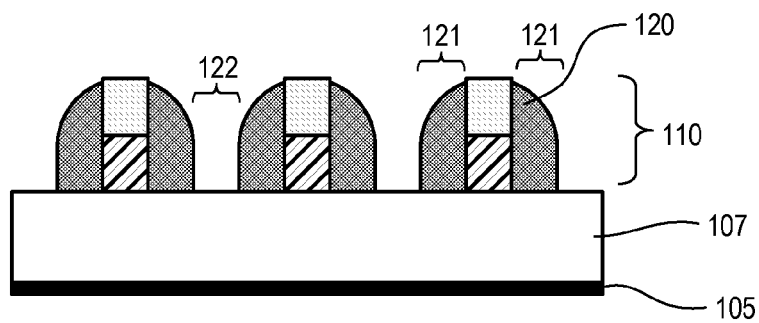

After deposition of the conformal film 120, sidewall spacers 121 are created from the conformal film 120. This can be accomplished by executing an anisotropic etch that removes conformal film material from top surfaces of the structures 110 and from the target layer 107 at locations between sidewall spacers, such as that shown by item 122 in FIG. 5. Note that some conformal film can remain on the target layer 107 at locations adjacent to the structures 110, but an area defined between sidewall spacers 121 (and, by extension, between structures 110) is removed. Thus, the conformal film 120 is etched such that the conformal film is at least removed from portions of target layer surfaces at locations between sidewall depositions of the conformal film.

Figure 6:
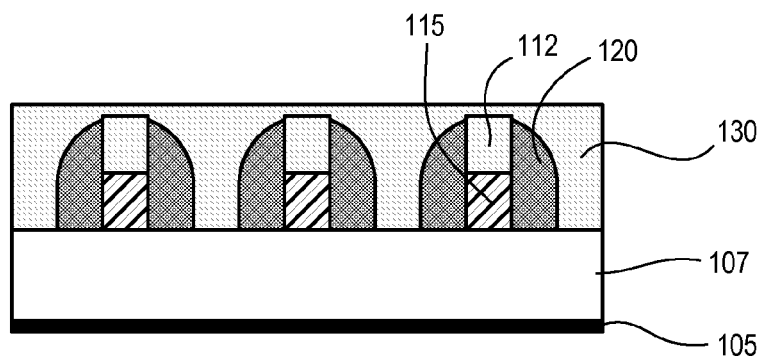

After sidewall spacers 121 have been created, a fill material 130 is deposited on the substrate 105 that fills spaces defined between the sidewall spacers 121 of the conformal film 120. An example result is shown in FIG. 6. Note that this fill deposition is not required to completely cover the upper material layer 112. Completely filling spaces between structures can be beneficial or convenient, but alternative embodiments can function with spaces being filled to a level at—or just above—the planarization stop material layer 115 (for example, above a silicon nitride top surface). Note that fill material 130 only needs to be deposited up to a top horizontal surface of the planarization stop material layer 115. In practice, however, it can be easier to overfill with the fill material 130. Thus, depositing the fill material can include depositing sufficient material to cover the top surface of the planarization stop material layer. In some embodiments an overfill can be three times greater than the height of the structures. The fill material 130 (gap fill material) can be amorphous carbon, polysilicon or any material that gives selectivity to the spacer material and the planarization stop material layer 115 so that it is possible to selectively exhume the conformal material. In some embodiments, particular types of photoresist can be used for fill material 130. Other options include amorphous silicon or a spin-on-glass (SOG) material. Ideal materials can be easily planarized using CMP. The fill material 130 can be deposited as a spin fill or any type of overcoat material that has selectivity to etching of the conformal film material. Amorphous carbon can be beneficial because it coats evenly, and can be easily planarized, and is relatively economical to apply, though other materials are also suitable.

At this point the substrate can then be planarized. Such planarization of the substrate is executed by removing conformal film material, deposited fill material, and upper material layer 112 such that a substantially planar surface is formed at a top surface of the planarization stop material layer 115 (given that the substrate is considered to be positioned horizontally). Planarization can be accomplished using chemical-mechanical polishing (CMP) techniques, which are conventionally known. Choice of materials can assist with CMP planarization. For example, the upper material layer can differ from the planarization stop material layer in that the upper material layer is removed from chemical-mechanical polishing at a rate greater than ten times a removal rate of the planarization stop material layer from chemical-mechanical polishing.

Figure 7:
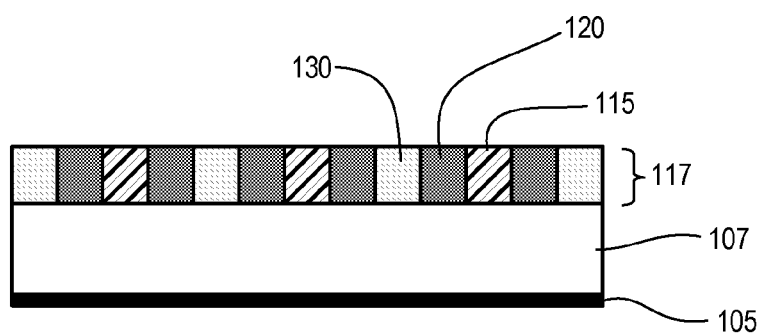
Figure 8:
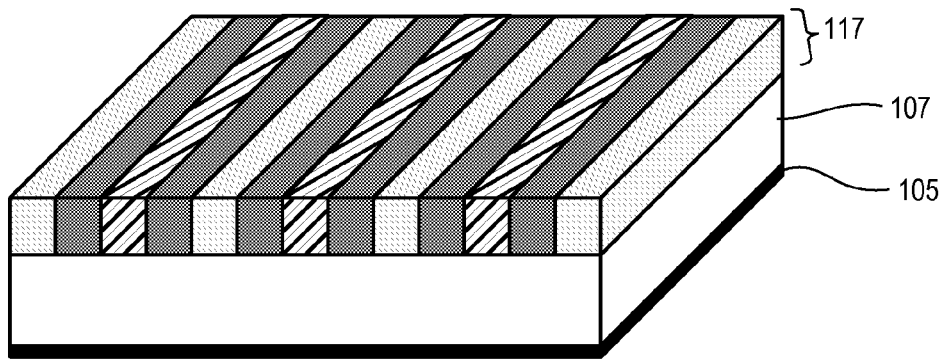
FIG. 8 is a cross-sectional schematic perspective view of an example substrate segment showing a process flow according to embodiments disclosed herein.
Figure 9:
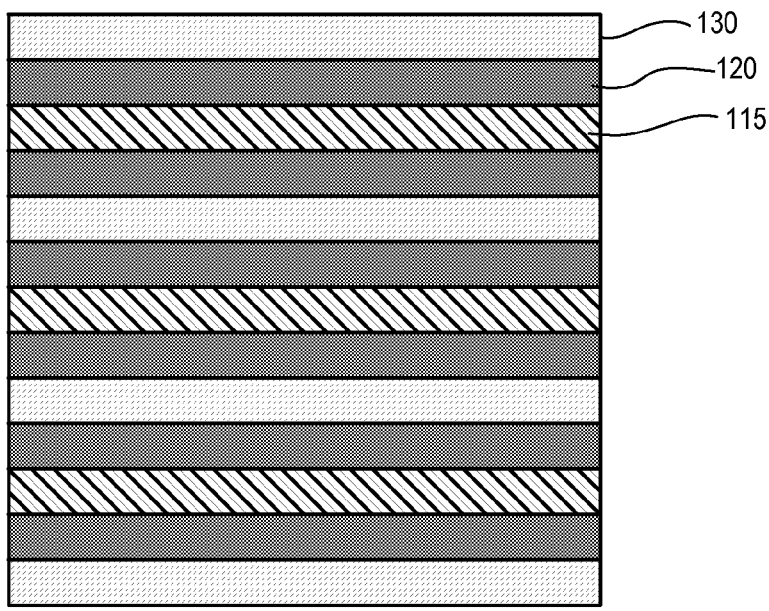
FIG. 9 is a cross-sectional schematic top view of an example substrate segment showing a process flow according to embodiments disclosed herein.

A result is shown in FIG. 7. FIG. 8 shows a perspective view of this result in which parallel lines of differing material are visible. Silicon nitride, for example, provides a good CMP-stop material. Accordingly, this patterning sequence for FIGS. 3-7 can be considered a line-generation sequence that converts a topographic pattern of double-stacked (or triple-stacked) mandrels at a given spacing into a planarized multi-line layer that includes parallel lines of oxide (or other material) alternatively bounded by silicon nitride and amorphous carbon (or other materials), as shown in the FIGS. 8 and 9. Thus, a film that originated as a space is now flanked on either side by two or more materials—flanked on one side by silicon nitride, and flanked on the other side by amorphous carbon. This multi-line layer, being planar, is thus "stackable" in that additional layers can be deposited on this planarized multi-line layer in various orientations. Stacking in a crossed orientation can define contact openings, slots, and other features. More details on stacking such patterns can be found in U.S. patent application Ser. No. 14/623,947 entitled "Method for Multiplying Pattern Density by Crossing Multiple Patterned Layers", which is hereby incorporated by reference in its entirety. Note that masking layers deposited on top of the planarized multi-line layer can have any given two-dimensional pattern. For example, a similar layer can be deposited or formed on top of the planarized multi-line layer for crossing linear features (using a crossing orientation). Alternatively, a photoresist mask can be deposited that has particular openings. Other layers or multi-patterning techniques can be used to define areas uncovered for pattern transfers. For example, a top mask layer may define only a few contact locations to transfer, with a remaining portion of the substrate being masked. In another example, a relatively large array of points is transferred into an underlying layer. Thus, any two-dimensional pattern can be positioned or created on top of the multi-line layer to help mask or define an area of conformal film material that is transferred.

Figure 10:
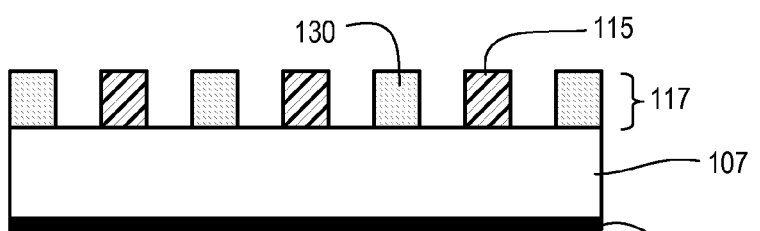
FIGS. 10-12 are cross-sectional schematic side views of an example substrate segment showing a process flow according to embodiments disclosed herein.
Figure 11:
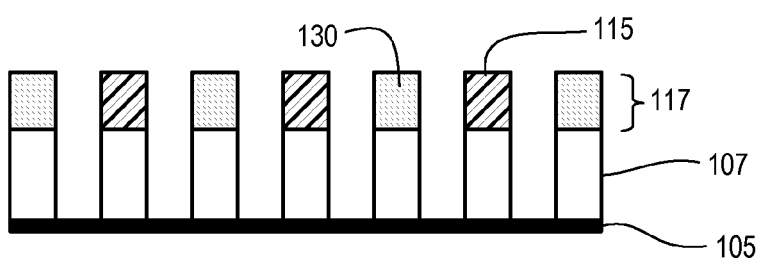
Figure 12:
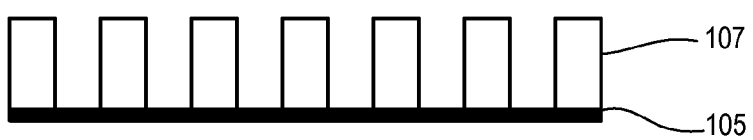

The resulting pattern 117 can be transferred into the target layer 107 by etching the conformal film material selective to the planarization stop material layer 115 and the fill material 130. FIG. 10 shows the conformal film 120 (remaining portions of the conformal film) having been removed. Accordingly, a pattern defined by the planarization stop material layer and the fill material is transferred into the target layer. Transferring the pattern can include executing an anisotropic etch process that etches conformal film material without substantially etching the fill material and the planarization stop material layer such that the fill material and the planarization stop material layer are used as a mask for transferring the pattern into the target layer. Thus, the resulting pattern 117 now can function as an etch mask for transferring into target layer 107. FIG. 11 shows an example result after target layer 107 has been etched. Remaining materials above target layer 107 can then be removed, yielding a patterned target layer as shown in FIG. 12. The reverse pattern or materials can also be used as an etch mask. Embodiments can include removing remaining portions of the fill material and the planarization stop material layer (instead of the conformal film) and then transferring a pattern defined by the conformal film material into the target layer.

Etching (exhuming) ALD materials is possible because of the CMP planarization step which cuts through the spacers prior to a subsequent transfer. Conventionally, in sidewall image transfer flows, it is the space between spacers that is used for transferring a pattern. With techniques herein however a CMP step is used on a double-stacked or multi-stacked mandrel to cut through the middle of a spacer. This cut spacer will be exhumed in a subsequent transfer step. Instead of using a space between sidewall spacers as a hard mask, a space previously occupied by a conformal film is transferred. Conventionally, sidewall spacers remain in a substrate stack and are used as the hardmask for transferring a pattern. Such a conventional technique, however, suffers from uniformity problems. For example, rounding effects from etched spacers do not allow scaling in smaller dimensions—or at least do not allow scaling uniformly.

The novel planarization step herein, in conjunction with the substrate stack used herein, blocks out non-uniformities that result from rounding effects. By having a double-stacked mandrel (or triple-stacked mandrel) a middle or planarization stop layer of the multi-stacked mandrel can be SiN functioning as a nitride CMP stop. Thus, the mandrel is provided or created with a CMP stop within the mandrel itself. Such mandrel creation can be executed by first depositing a silicon nitride film and then depositing amorphous carbon film on top of the nitride film. A height or thickness of the nitride layer can be selected such that a CMP step can cut into a spacer at an optimal point to remove rounding effects of an upper portion of the spacer (a point below rounded spacer edges, and above any mandrel footers). This helps to provide an oxide runner or line having a substantially rectangular cross-section. This helps provide a smooth, planar surface for stacking multi-line pitch-reducing layers.

In some embodiments, an oxide or oxide-like film can be deposited underneath the nitride film (CMP stop layer), which can eliminate any further problems created from etching a pre-pattern to create the multi-layer mandrels. Thus the oxide or oxide-like film is etched as if it were an oxide such that any protruding feet will not block a final oxide film etch when transferring a pattern to an underlying target layer.

Figure 13:
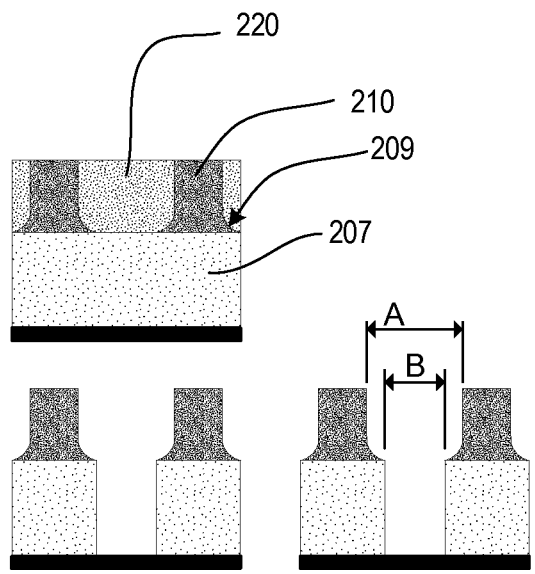
FIG. 13 is a cross-sectional side view illustration of an example substrate segment showing conventional challenges with pattern transfer.

FIG. 13 illustrates this conventional challenge. Mandrels 210 positioned on the target layer 207 have a spacer material 220 filled there between. Note that when transferring a pattern via a hardmask into an underlying layer, such as when forming a mandrel, a footer 209 can result at the interface of the mandrels 210 and the target layer 207. The footer 209 is essentially mandrel material without a smooth vertical surface that juts out into a trench. When a given mandrel is eventually used as an etch mask, the footer 209 of the mandrel material prevents transferring a desired critical dimension. Note that dimension-A, spans from sidewall to sidewall of the mandrels 210 and is a desired dimension to be transferred. The actual dimension transferred, however, is dimension-B, which is a noticeably smaller dimension. Because of this footer problem, many desired patterning techniques are not conventionally being implemented.

Figure 14:
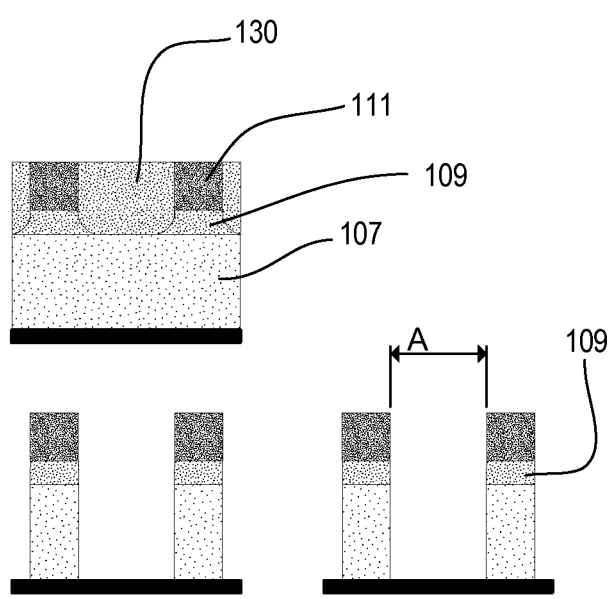
FIG. 14 is a cross-sectional side view illustration of an example substrate segment showing accurate pattern transfer according to embodiments herein.

Referring now to FIG. 14, techniques herein, however, solve this footer problem so that desired critical dimensions can be transferred to underlying layers. Embodiments herein address the footer problem by using a pedestal 109 positioned under (as part of) a double or triple layer mandrel. A material selected for the pedestal 109 is a material that has similar etch properties as the spacer material. Thus, the pedestal material can be identical to the spacer material, or simply be etched similarly (etched with a same chemistry). In other words, when executing an anisotropic etch of the spacer material, any footer of the pedestal that sticks out into a trench or hole being etched will appear the etch process chemistry as the spacer material and be etched along with the spacer material. As can be seen in the FIG. 14, a critical dimension A of the mandrel 111 can be successfully transferred to the target layer. Note that feet from pedestal 109 have been trimmed during the transfer etch resulting in substantially vertical sidewalls from the mandrel 111 through the target layer 107.

Figure 15:
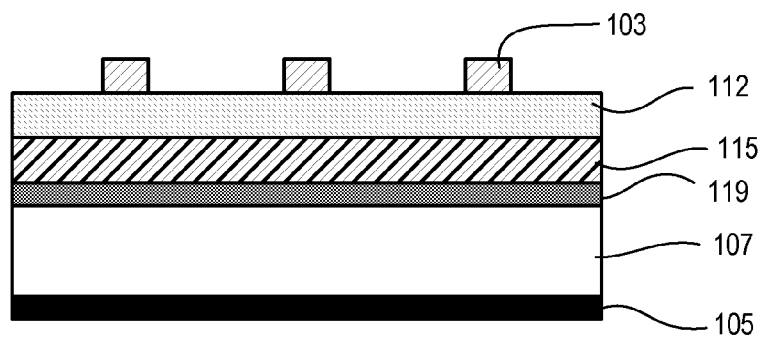
FIGS. 15-21 are cross-sectional schematic side views of an example substrate segment showing a process flow according to embodiments disclosed herein.
Figure 16:
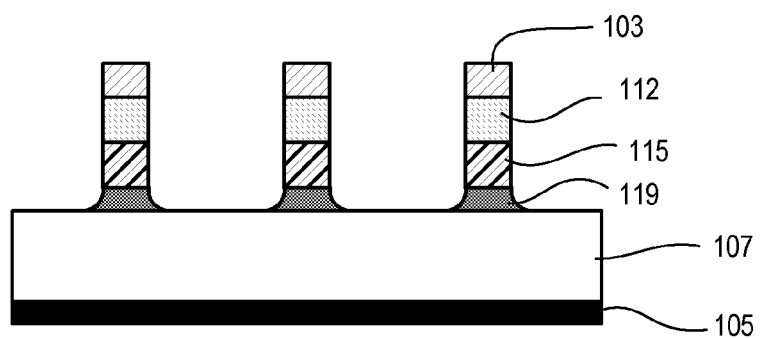
Figure 17:
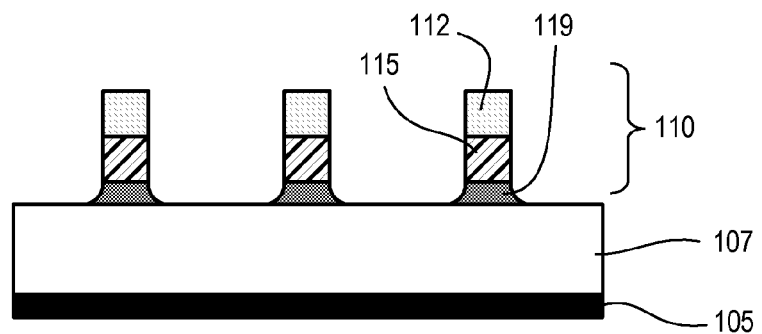

Accordingly, such footer related pattern transfer problems can be overcome by using a tri-stacked mandrel. FIGS. 15-30 illustrate a fabrication sequence that is similar to the above-described sequence except that the mandrels include a pedestal or lower material layer 119. This lower material layer 119 can be applied as a film when depositing three or more layers from which mandrels will be created. FIG. 15 shows the addition of lower material layer 119 as compared to FIG. 1. The lower material layer 119 is selected to have etch properties similar to that of the conformal film material. The pre-pattern 103 can be transferred into a substrate stack (FIG. 16) and then removed to yield a tri-layer mandrel as shown in FIG. 17. Note that the lower material layer 119 is shown having feet or a protruding portion. In other words, the lower material layer 119 does not have an essentially vertical sidewall, but instead has a curvature that extends away from vertical sidewalls of the planarization stop material layer 115.

Thus, another embodiment is a method of patterning a substrate for planarization. This method includes providing a substrate having a relief pattern of structures located on a target layer 107. Structures 110 in the relief pattern of structures comprising at least three layers of material including a lower material layer 119 positioned on the target layer 107, a planarization stop material layer 115 positioned on the lower material layer 119, and an upper material layer 112 positioned on the planarization stop material layer 115. The planarization stop material layer 115 differs from the upper material layer 112 and the lower material layer 119, at least by composition. Planarization stop material layer 115 can be designed to resist chemical-mechanical polishing at a rate greater than ten times that of the upper material layer 112.

Figure 18:
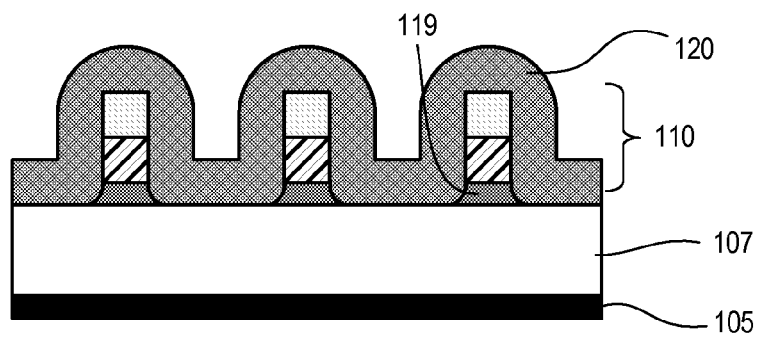
Figure 19:
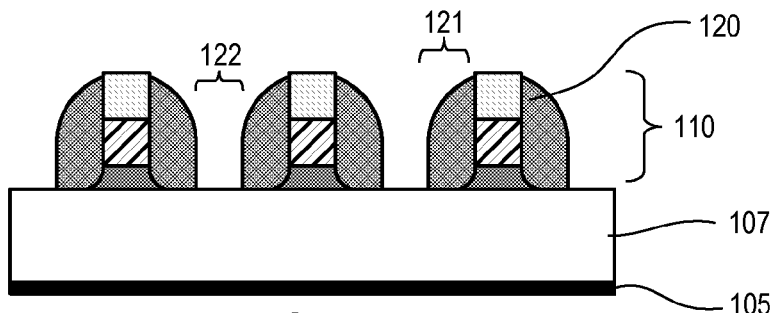

Conformal film 120 is deposited on exposed surfaces of the target layer 107 and on exposed surfaces of the structures 110 such that sidewall depositions result on vertical surfaces of the structures. Material of the conformal film selected such that a particular etch chemistry can etch both the conformal film 120 and material from the lower material layer 119. FIG. 18 shows an example result of this process step. The conformal film 120 is anisotropically etched such that the conformal film 120 is removed from target layer 107 surfaces at locations between sidewall depositions of the conformal film. An example result is shown in FIG. 19.

Figure 20:
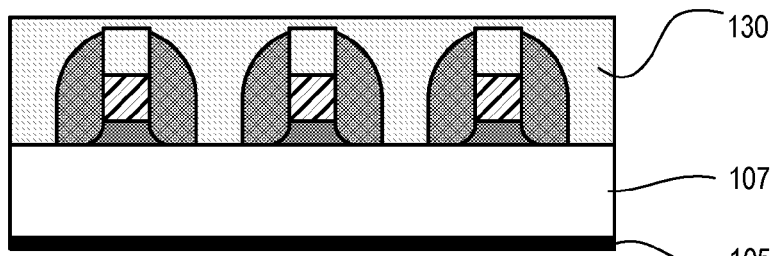
Figure 21:
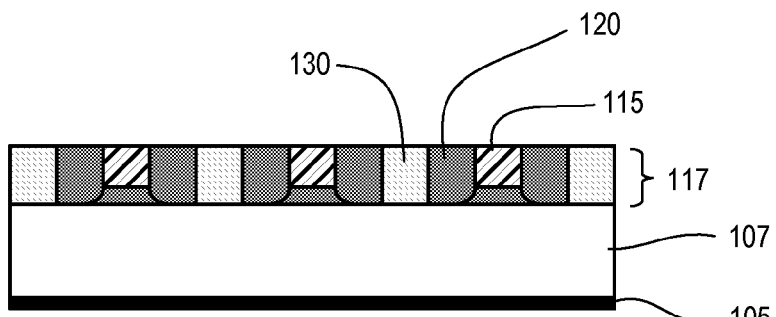
Figure 22:
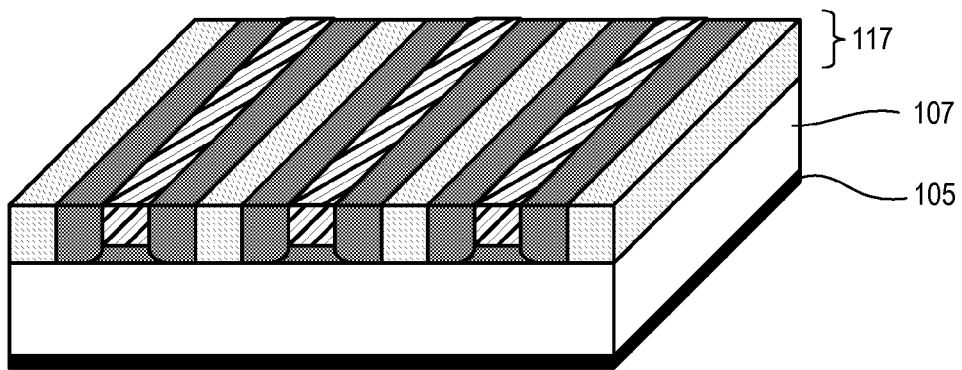
FIG. 22 is a cross-sectional schematic perspective view of an example substrate segment showing a process flow according to embodiments disclosed herein.

A fill material 130 is deposited that fills spaces defined between the sidewall depositions of the conformal film 120, as shown in FIG. 20. As described above, the substrate is planarized by removing conformal film material, upper material layer, and fill material above a top surface of the planarization stop material layer such that a planar surface is formed, as shown in FIG. 21 and FIG. 22.

Figure 23:
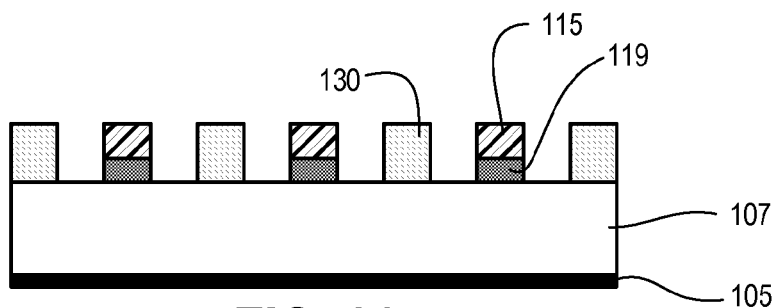
FIGS. 23-30 are cross-sectional schematic side views of an example substrate segment showing a process flow according to embodiments disclosed herein.
Figure 24:
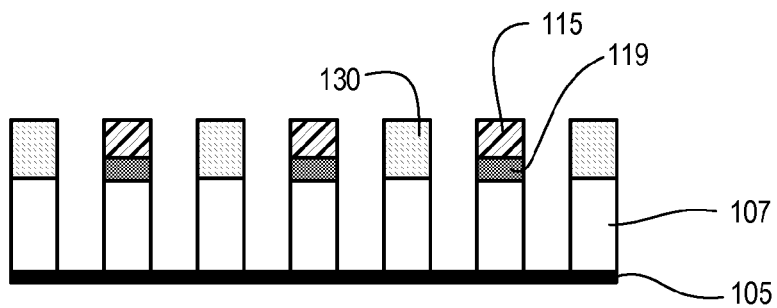

Referring to FIG. 23, remaining portions of conformal film can be removed, such as by using an anisotropic etch. Note that because lower material layer 119 etches with the conformal film, a vertical etch profile results down to the target layer 107. In other embodiments, lower material layer 119 does not etch with a particular chemistry used to etch the conformal film, but there is still etch selectivity between lower material layer 119 and fill material 130 and planarization stop material layer 115 so as to be able to remove any footer with a second chemistry.

Figure 25:
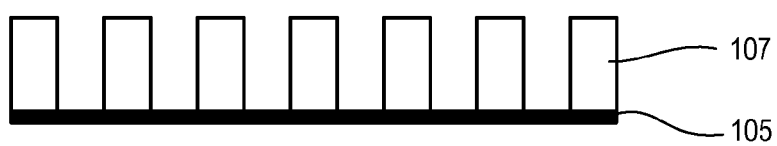
Figure 26:
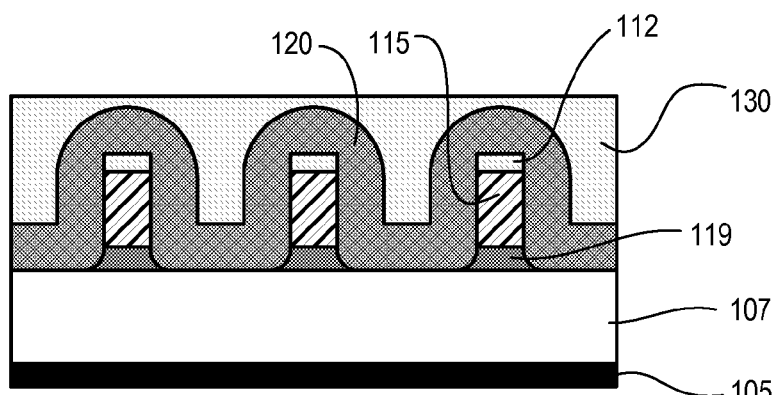

A resulting pattern can then be used as a mask to transfer a pattern into target layer 107. For example a pattern defined by the planarization stop material layer 115 and the fill material 130 is transferred into the target layer 107 as shown in FIG. 25.

In other embodiments, and typically when a height of a given tri-layer mandrel is sufficient, a spacer step like that of FIG. 19 can be optional. With sufficient distance between the top surface of the planarization stop material layer and a top surface of the conformal film at locations between sidewall depositions, a fill material can be applied directly after depositing the conformal film, with sufficient space to form a plug from the fill material to provide an etch mask. FIG.

Figure 27:
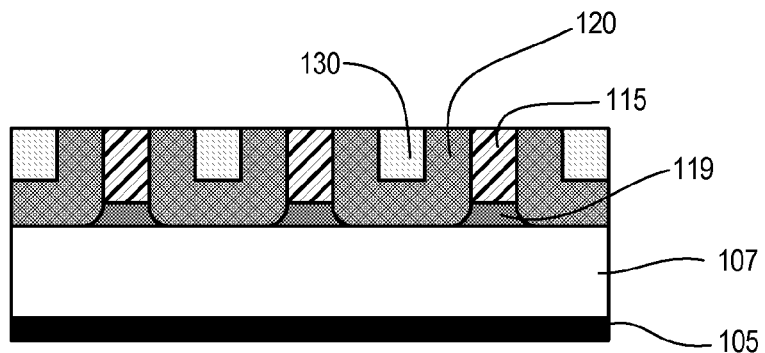
Figure 28:
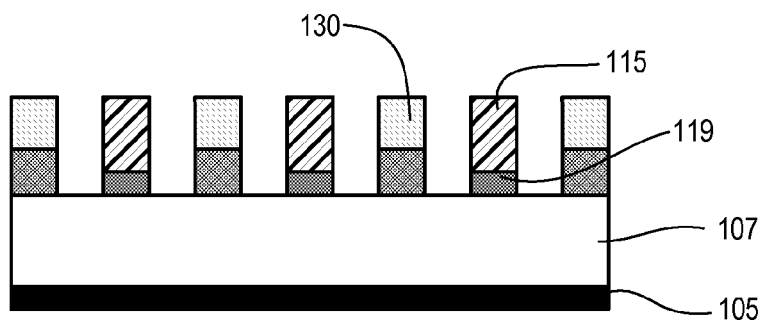
Figure 29:
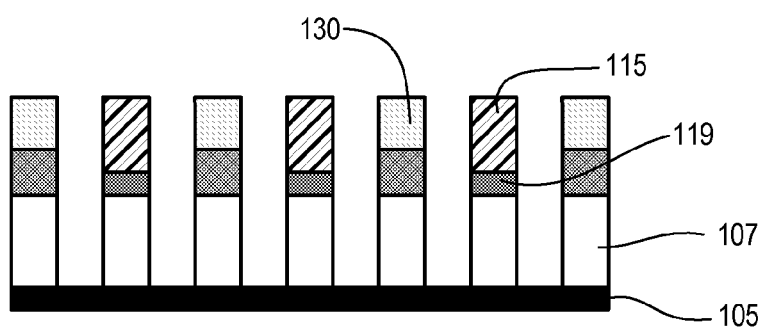
Figure 30:
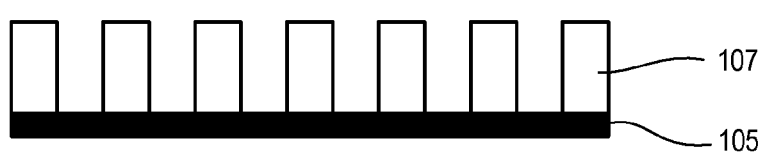

26 shows an example illustration of depositing fill material 130 without a spacer etch. The substrate can then be planarized at this point using a CMP-type planarization as described above. An example result of a substrate after this planarization is shown in FIG. 27. Note that fill material 130 is surrounded by conformal film 120. Fill material 130 essentially functions as a plug or mask to prevent etching of conformal film immediately below the plug. Accordingly, conformal film material can be anisotropically etch down to target layer 107 (FIG. 28) and transferred into target layer 107 (FIG. 29). Remaining masking material can be removed resulting in a target layer 107 now being a patterned layer as shown in FIG. 30

Accordingly, these patterning processes herein can provide significant improvements in feature size reduction, feature density, and feature resolution.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate for planarization, the method comprising:
providing a substrate having a relief pattern of structures located on a target layer, structures in the relief pattern of structures comprising at least two layers of material including an upper material layer positioned on a planarization stop material layer, the upper material layer differing from the planarization stop material layer;
depositing a conformal film on exposed surfaces of the target layer and on exposed surfaces of the structures such that sidewall depositions result on vertical surfaces of both the upper material layer and the planarization stop material layer of the structures;
etching the conformal film such that the conformal film is at least removed from portions of target layer surfaces at locations between sidewall depositions of the conformal film;
depositing a fill material that at least partially fills spaces defined between the sidewall depositions of the conformal film; and
planarizing the substrate by removing conformal film material, upper material layer, and fill material above a top surface of the planarization stop material layer such that a planar surface is formed at the top surface of the planarization stop material layer.

2. The method of claim 1, further comprising etching remaining portions of the conformal film.

3. The method of claim 2, further comprising transferring a pattern defined by the planarization stop material layer and the fill material into the target layer.

4. The method of claim 3, wherein transferring the pattern includes executing an anisotropic etch process that etches conformal film material without substantially etching the fill material and the planarization stop material layer such that the fill material and the planarization stop material layer are used as a mask for transferring the pattern into the target layer.

5. The method of claim 1, wherein depositing the fill material includes depositing sufficient material to cover the top surface of the planarization stop material layer.

6. The method of claim 1, wherein depositing the conformal film includes depositing the conformal film via atomic layer deposition (ALD).

7. The method of claim 1, wherein the upper material layer differs from the planarization stop material layer by composition.

8. The method of claim 7, wherein the upper material layer differs from the planarization stop material layer in that the upper material layer is removed from chemical-mechanical polishing at a rate greater than ten times a removal rate of the planarization stop material layer from chemical-mechanical polishing.

9. The method of claim 1, further comprising:
removing remaining portions of the fill material and the planarization stop material layer; and
transferring a pattern defined by the conformal film material into the target layer.

10. A method of patterning a substrate for planarization, the method comprising:
providing a substrate having a relief pattern of structures located on a target layer, structures in the relief pattern of structures comprising at least three layers of material including a lower material layer positioned on the target layer, a planarization stop material layer positioned on the lower material layer, and an upper material layer positioned on the planarization stop material layer, the planarization stop material layer differing from the upper material layer and the lower material layer;

depositing a conformal film on exposed surfaces of the target layer and on exposed surfaces of the structures such that sidewall depositions result on vertical surfaces of each of the upper material layer and the planarization stop material layer, and the lower material layer of the structures, material of the conformal film selected such that a particular etch chemistry can etch both the conformal film and material from the lower material layer;

etching the conformal film anisotropically such that the conformal film is removed from target layer surfaces at locations between sidewall depositions of the conformal film;

depositing a fill material that fills spaces defined between the sidewall depositions of the conformal film; and planarizing the substrate by removing conformal film material, upper material layer, and fill material above a top surface of the planarization stop material layer such that a planar surface is formed.

11. The method of claim 10, further comprising etching remaining portions of the conformal film.

12. The method of claim 10, further comprising transferring a pattern defined by the planarization stop material layer and the fill material into the target layer.

13. The method of claim 12, wherein transferring the pattern includes executing an anisotropic etch process that etches conformal film material without etching the fill material and the planarization stop material layer such that the fill material and the planarization stop material layer are used as a mask for transferring the pattern into the target layer.

14. The method of claim 10, wherein the upper material layer differs from the planarization stop material layer by composition.

15. The method of claim 14, wherein the upper material layer differs from the planarization stop material layer in that the upper material layer is removed from chemical-mechanical polishing at a rate greater than ten times a removal rate of the planarization stop material layer from chemical-mechanical polishing.

16. The method of claim 10, wherein providing the substrate comprises:

depositing the lower material layer on the target layer;

depositing a planarization stop material layer on the lower material layer;

depositing an upper material layer on the planarization stop material layer; and etching a pattern into the upper material layer, the planarization stop material layer, and the lower material layer thereby creating the relief pattern of structures.

17. A method of patterning a substrate for planarization, the method comprising:

providing a substrate having a relief pattern of structures located on a target layer, structures in the relief pattern of structures comprising at least three layers of material including a lower material layer positioned on the target layer, a planarization stop material layer positioned on the lower material layer, and an upper material layer positioned on the planarization stop material layer, the planarization stop material layer differing from the upper material layer and the lower material layer;

depositing a conformal film on exposed surfaces of the target layer and on exposed surfaces of the structures such that sidewall depositions result on vertical surfaces of each of the upper material layer and the planarization stop material layer, and the lower material layer of the structures, material of the conformal film selected such that a particular etch chemistry can etch both the conformal film and material from the lower material layer;

depositing a fill material that fills spaces defined between the sidewall depositions of the conformal film; and planarizing the substrate by removing conformal film material, upper material layer, and fill material above a top surface of the planarization stop material layer such that a planar surface is formed.

18. The method of claim 17, further comprising etching remaining portions of the conformal film.

19. The method of claim 18, further comprising transferring a pattern defined by the planarization stop material layer and the fill material into the target layer.

20. The method of claim 19, wherein the upper material layer differs from the planarization stop material layer in that the upper material layer is removed from chemical-mechanical polishing at a rate greater than ten times a removal rate of the planarization stop material layer from chemical-mechanical polishing.

* * * * *